(12) United States Patent
Klein et al.

(10) Patent No.: US 9,112,078 B2
(45) Date of Patent: Aug. 18, 2015

(54) METHOD OF RECOGNIZING AND ASSESSING SHADOWING EVENTS

(75) Inventors: Jens Klein, Goettingen (DE); Bjoern Magnussen, Kassel (DE); Andreas Strusch, Ihringshausen (DE); Alexander Smith, New York, NY (US); William Gaggioli, Mission Viejo, CA (US)

(73) Assignee: SMA Solar Technology AG, Niestetal (DE)

( * ) Notice: Subject to any disclaimer, the term of this patent is extended or adjusted under 35 U.S.C. 154(b) by 172 days.

(21) Appl. No.: 13/155,755

(22) Filed: Jun. 8, 2011

(65) Prior Publication Data

US 2011/0307199 A1 Dec. 15, 2011

(30) Foreign Application Priority Data

Jun. 9, 2010 (EP) ..................................... 10165349

(51) Int. Cl.
*H01L 31/042* (2014.01)
*H02S 50/10* (2014.01)
*F24J 2/38* (2014.01)
*F24J 2/00* (2014.01)

(52) U.S. Cl.
CPC .............. *H01L 31/042* (2013.01); *H02S 50/10* (2014.12); *F24J 2002/0084* (2013.01); *F24J 2002/385* (2013.01); *Y02E 10/50* (2013.01)

(58) Field of Classification Search
CPC .... G01R 31/405; H01L 31/042; Y02E 10/50; G06F 19/00; F24J 2002/0084; F24J 2002/385
See application file for complete search history.

(56) References Cited

U.S. PATENT DOCUMENTS

| 5,637,155 | A | 6/1997 | Inoue |
| 6,966,184 | B2 | 11/2005 | Toyomura et al. |
| 7,305,983 | B1 | 12/2007 | Meder et al. |
| 7,864,497 | B2 | 1/2011 | Quardt et al. |
| 2004/0159102 | A1 | 8/2004 | Toyomura et al. |
| 2007/0150198 | A1* | 6/2007 | MacDonald ...................... 702/2 |
| 2009/0171597 | A1* | 7/2009 | Drews ............................ 702/60 |
| 2009/0177458 | A1 | 7/2009 | Hochart et al. |
| 2010/0332167 | A1* | 12/2010 | Nuotio et al. .................... 702/65 |

FOREIGN PATENT DOCUMENTS

| DE | 20102619 A1 | 5/2001 |
| DE | 102006008178 A1 | 8/2007 |
| EP | 1429394 A2 | 6/2006 |
| WO | 2006079503 A2 | 8/2006 |

OTHER PUBLICATIONS

Nguyen, Performance Evaluation of Solar Photovoltaic Arrays Including Shadow Effects Using Neural Network, IEEE, 2009.*
European Search Report Dated Sep. 10, 2010 for European Application No. EP10165349. 4 Pages.

* cited by examiner

*Primary Examiner* — Eliseo Ramos Feliciano
*Assistant Examiner* — Kyle R Quigley
(74) *Attorney, Agent, or Firm* — Eschweiler & Associates, LLC

(57) ABSTRACT

For recognizing shadowing events affecting a photovoltaic module, electric power produced by the module is recorded. For each position of the sun on a present day an expected value of the electric power is defined. Further, an ideal power course of the electric power over the present day is determined by fitting a curve that corresponds to cloudless sun without shadow casting obstacles to peak values of the electric power recorded for same positions of the sun during a plurality of previous days. For all positions of the sun at which the electric power produced on the present day falls short of the ideal power course a shadowing probability of not less than zero is defined whose magnitude depends on the level of accord of the electric power produced on the present day with the expected value at the position of the sun.

19 Claims, 6 Drawing Sheets

METHOD OF RECOGNIZING AND ASSESSING SHADOWING EVENTS

CROSS REFERENCE TO RELATED APPLICATIONS

This application claims priority to co-pending European Patent Application No. EP 10 165 349.1 entitled "Verfahren zum Erkennen und Beurteilen von Verschattungen", filed Jun. 9, 2010.

FIELD

The invention relates to a method of recognizing shadowing events affecting at least one photovoltaic module. Particularly, the present invention relates to recognizing shadowing of a photovoltaic module by differentiating shadowing from other reasons why the photovoltaic module produces a lower electric power than its maximum electric power possible at the position of the sun on the present day. Further, the invention also relates to assessing a recognized shadowing event.

BACKGROUND

German utility model publication DE 201 02 619 U1 discloses a display for a solar power system. In the display, a day target curve of the power produced by the solar power system is calculated. This day target curve is then continuously fitted to the actually possible power of the particular solar power system by learning under error-free conditions. A precondition for this procedure is an additional measurement of the solarization intensity actually present. The first day target curve is calculated depending on the location of the solar power system (latitude and longitude) and the seasonal position of the sun which is adjusted daily or monthly. In this way, environmental limitations to the optimum orientation of the photovoltaic modules of the solar power system have an impact on the first daily curve. If, after the learning phase, the actual value of the power produced by the solar power system differs from the learned target curve by more than an adjustable degree, this is pointed out to the user. In the known display, repeated shadowing events affecting the photovoltaic modules of the solar power system have an influence on the learned target curve. However they are neither recognized as such nor assessed with regard to their importance.

A method of controlling a solar power system comprising several photovoltaic modules is known from DE 10 2006 008 178 A1. Here, comparative measurements between the individual photovoltaic modules are performed for a permanent power control. If deviations between the measurement values occur, these are interpreted as an indication that the photovoltaic system needs a revision. With regard to the deviations occurring, it shall be differentiated between whether it is an environmental disturbance like shadowing by clouds, trees or immovables, or an irreversible mechanical or electrical damage. Details enabling this differentiation, however, are not found in DE 10 2006 008 178 A1.

There still is a need for a method which enables recognizing shadowing of a photovoltaic module with high reliability and which thus provides a basis for suitably assessing the consequences of the respective shadowing.

SUMMARY

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention relates to a method of recognizing shadowing events affecting at least one photovoltaic module. This method comprises: recording an electric power produced by the at least one photovoltaic module; and defining an ideal power course of the electric power produced by the at least one photovoltaic module over a present day by fitting a curve to peak values of the electric power recorded for same positions of the sun on a plurality of previous days, the curve corresponding to cloudless sun without shadow casting obstacles over the entire day. Further, for each position of the sun on the present day, an expected value of the electric power produced by the at least one photovoltaic module is defined. Deviations of the electric power produced by the at least one photovoltaic module on the present day from the ideal power course are detected; and for all positions of the sun at which the electric power produced by the at least one photovoltaic module on the present day falls short of the ideal power course, a shadowing probability of not less than zero is defined. The height of the shadowing probability depends on the level of accord of the electric power produced by the at least one photovoltaic module with the expected value at the respective position of the sun.

Further, the present invention relates to a method of recognizing shadowing of at least one photovoltaic module. This method comprises: recording an electric power produced by the at least one photovoltaic module; defining an expected power course of the electric power produced by the at least one photovoltaic module over a present day from maximum values of the electric power recorded for same positions of the sun during a plurality of previous days; and defining an ideal power course by fitting a curve which corresponds to cloud-free sun without shadow casting obstacles over the full present day to peak values of the expected power course. Further, positions of the sun on the present day for which the expected power course falls short of the ideal power course are determined; and the electric power produced by the at least one photovoltaic module on the present day is compared with the expected power course. For each position of the sun on the present day, it is evaluated to what extent the electric power produced by the at least one photovoltaic module accords with the expected power course on the present day; and for each position of the sun on the present day, a shadowing probability of not less than zero is defined. The height of the shadowing probability decreases with the decreasing level of accord of the electric power produced by the at least one photovoltaic module at the position of the sun on the present day with the expected power course.

Further, the present invention relates to a method of recognizing shadowing events affecting a plurality of similar photovoltaic modules. This method comprises: recording the electric power produced by the individual photovoltaic modules of the plurality of similar photovoltaic modules; normalizing the electric power produced by the individual photovoltaic modules to a common standard; defining an expected value of the electric power produced by each individual photovoltaic module for each position of the sun as a maximum value of the normalized electric power which are at the same time produced by the individual photovoltaic modules at this position of the sun; and defining an ideal power course of the electric power produced by each individual photovoltaic module over a present day by fitting a curve to peak values of the electric power recorded for at least one photovoltaic module of the plurality of similar photovoltaic modules at same positions of the sun during a plurality of previous days, the curve corresponding to cloud-free sun without shadow casting obstacles over the entire day. The electric power produced by each individual photovoltaic module at each position of the sun on the present day is compared with the respective ideal power course and the respective expected value; and for all positions of the sun, at which the electric power produced by the any individual photovoltaic module falls short of the ideal power course on the present day, a shadowing probability for the respective photovoltaic module of not less than zero is defined. The height of the shadowing probability for the respective photovoltaic module increases with an increasing level of undershooting the respective expected value by the normalized electric power produced by the respective photovoltaic module at the respective position of the sun.

The present invention also relates to a method of assessing shadowing events affecting at least one photovoltaic module. The method comprises: for all positions of the sun at which the electric power produced by the photovoltaic module on the present day falls short of an ideal power course over a present day, defining a shadowing probability of not less than zero; and entering the shadowing probabilities at the respective positions of the sun in an annual overview map of the positions of the sun, the overview map indicating the azimuth and the elevation angles of the positions of the sun.

Other features and advantages of the present invention will become apparent to one with skill in the art upon examination of the following drawings and the detailed description. It is intended that all such additional features and advantages be included herein within the scope of the present invention, as defined by the claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention. In the drawings, like reference numerals designate corresponding parts throughout the several views.

DETAILED DESCRIPTION

Figure 1:
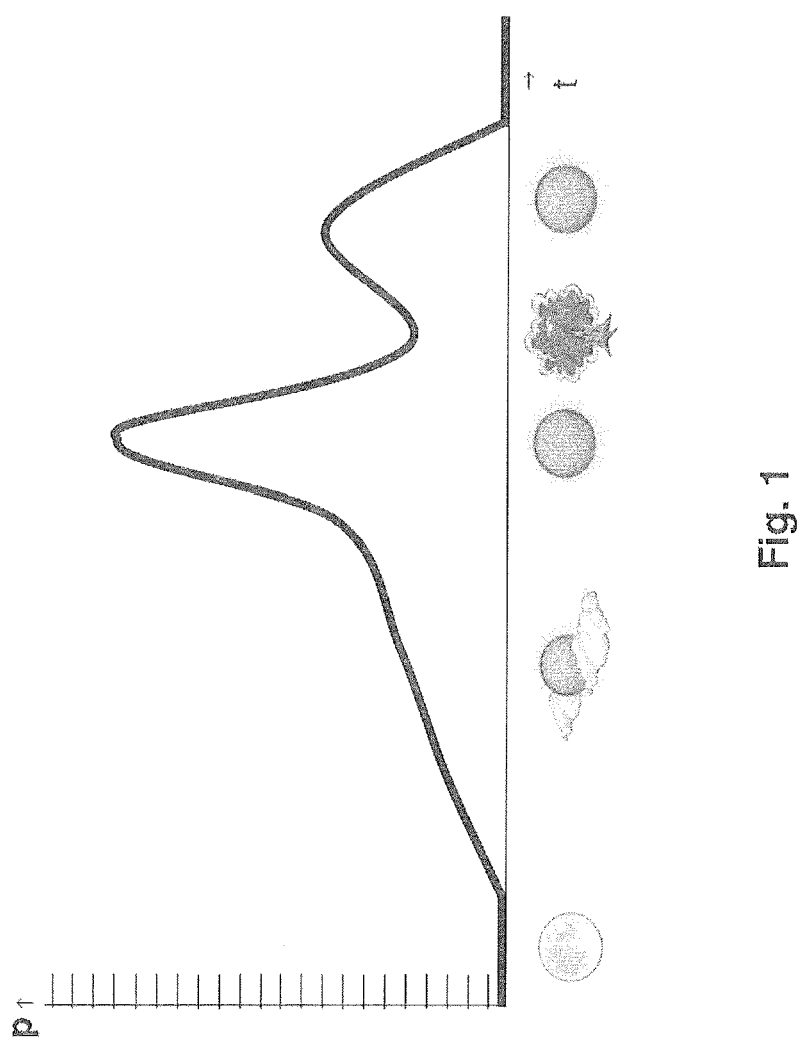
FIG. 1 illustrates a real power course of electric power produced by a photovoltaic module over one day, reasons for deviations from an ideal power course corresponding to cloudless and shadow-free sun over the entire day being indicated by symbols.

In this application, the term shadowing relates to shadows cast by an obstacle between the photovoltaic module and the sun, which is essentially opaque and particularly stationary. According to this definition, clouds do not cause shadowing of a photovoltaic module.

In assessing a recognized shadowing effect, it is a particular aim to determine its consequence in that, for example, the amount of energy which is not realized due to the shadowing within one year is quantified. On this basis, decisions may be made with regard to removing obstacles which cause shadowing.

In this application, the term "photovoltaic module" refers to a unit comprising a plurality of photovoltaic or solar cells in a series and/or parallel arrangement whose electric power is forwarded together, i.e. via common lines, and which may, for example, be physically incorporated in a so-called solar panel. Such a photovoltaic module may also be subdivided into several individual solar panels which are only combined with regard to their common connections. Vice versa, a solar panel may comprise several photovoltaic modules, if individual connection lines and corresponding facilities for monitoring the electric power produced by the individual photovoltaic modules are provided.

In so far as the term "position of the sun" is used in defining the invention of this application, it shall also include the meaning "time of the day". In other words, the time of the present day may be used as a measure of the position of the sun, and in doing so changes in the position of the sun at the same time of consecutive days may be discounted, although this may not be ideal.

Further, the formulations "monitoring or recording the electric power produced by the respective photovoltaic module" as used in this application is not to be interpreted so narrowly that the actual electric power has to be monitored as such. Instead, it will be sufficient to monitor or record an electric parameter which changes with the electric power produced by the photovoltaic module. Ideally, this electric parameter will change proportionally with the electric power produced by the photovoltaic module, but this is not necessary. In the method of the present invention, such an electric parameter may be used instead of the provided electric power, even if it may not be unambiguously converted into the electric power produced. However, as power losses due to shadowing of the photovoltaic modules are also of interest in the present invention, it is preferred if the electric power produced can be calculated from the electric parameter.

In the method of the present invention shadowing of the photovoltaic module is recognized based on operation data of the photovoltaic module only, i.e. without using an additional solarization or shadowing sensor, for example. This is possible because statistical variations are effectively separated from the expected power course of the photovoltaic module which thus only includes systematic variations of the electric power. The comparison of this expected power course with the ideal power course defined for the actual photovoltaic module allows for drawing conclusions with regard to shadowing of the photovoltaic module at certain positions of the sun with high certainty.

Actually, the expected value for the electric power at each position of the sun may be defined as a maximum value of the electric power at same positions of the sun during the plurality of previous days; and the height of the shadowing probability may in this case increase with increasing level of accord of the electric power produced by the photovoltaic module at the respective position of the sun with the expected value.

In the method of the present invention, the electric power actually produced by the photovoltaic module which have been recorded in the past are used to define the ideal power course of the photovoltaic module. By means of considering maximum values of the electric power produced by the photovoltaic module at the respective position of the sun only, electric power produced under conditions without clouds or with minimum cloudiness are considered only. However, these maximum values still show the influence of shadowing effects on the electric power produced by the photovoltaic module, as long as these shadowing effects are always present at certain positions of the sun. To suppress the influence of these shadowing effects in defining the ideal power course, a curve which corresponds to cloud-free sun without shadow casting obstacles over the entire day is fitted to the peak values of the electric powers recorded during the previous days only. Any curve fitting may be used as this curve; it may, however, also be generated from a physical model of the photovoltaic module, optionally considering the location and/or the orientation of the photovoltaic module.

For example, those maximum values of the electric power recorded for the same positions of the sun, which are found at local maxima of the course of these maximum values of the electric powers over a day, may be selected as the peak values to which the curve is fitted for defining the ideal power course.

Within the scope of the present invention, the peak values may be smoothed or filtered prior to fitting the curve for defining the ideal power course. For example, average values of the highest electric powers at the respective position of the sun may be formed, or the absolutely highest values may even be discarded as outliers and only the second highest electric powers may be considered. Fitting itself may be executed using any suitable known algorithm.

The ideal power course of the electric power over the day defined in this way is used to detect positions of the sun at which the electric power produced by the respective photovoltaic modules on the present day falls short of ideal power course. Only then, a probability of a shadowing event exists at all.

For the purpose of recognizing the reason for falling short of the ideal power course, an expected value of the electric power produced by the photovoltaic module is additionally defined in the method of the present invention. If only one photovoltaic module is considered, this expected value is the already mentioned maximum value of the electric power at the corresponding position of the sun during the number of previous days. This maximum value may be smoothed or filtered in the same way as the peak values in defining the ideal power course of the electric power. If the maximum value is reached on the present day, but the ideal power course is nevertheless not reached, this means that the electric power produced by the photovoltaic module at the corresponding position of the sun always falls short of the ideal power course, namely at the same degree on each cloud-free day. Based on this consideration, a shadowing probability of not less than zero is defined for each position of the sun at which the electric power produced by the photovoltaic module on the present day falls short of the ideal power course in the method of the present invention, the actual height of the shadowing probability depending on the level of accord of the electric power produced by the photovoltaic module with the expected value at the position of the sun.

In the method of the present invention, periodically occurring clouds may have an influence on the expected value for certain positions of the sun. The probability, however, that such clouds always result in a same percentaged loss of electric power with regard to the ideal power course is only minimal. Thus, in practice, they do not result in erroneously assuming a shadowing event.

This particularly applies if in case of only a single photovoltaic module the shadowing probability for each position of the sun at which the electric power produced by the photovoltaic module on the present day at the position of the sun reaches or even exceeds the ideal power course is set to a value of not more than zero, as reaching the ideal power at this position of the sun is only possible without shadowing. Values of a probability of less than zero do not directly make logical sense. In case of averaging over different probability values, however, negative probability values of high weight may nevertheless make sense to compensate for presumed false positive probability values.

The expected value for each position of the sun on the present day may also be defined as a maximum value of normalized electrical powers which are produced by several similar photovoltaic modules at the respective position of the sun on the present day. In this case, the height of the shadowing probability for each photovoltaic module increases with the level of undershooting the expected value by the normalized electric power produced by the respective photovoltaic module at the respective position of the sun.

If several photovoltaic modules and the corresponding power data are available, it is not necessary to use an expected power course defined on the basis of measurement values from the past for determining the expected value of the electric power. Instead, the normalized present maximum value of the electric power produced by the individual photovoltaic modules may be defined as the expected value. Here, the maximum value does not necessarily have to be the absolutely highest present normalized value of the electric power produced by one individual photovoltaic module but may, for example, be the second or even third highest normalized value or an average value of the highest normalized values. A similarity of the photovoltaic module is a precondition only in so far as their powers may be normalized with regard to each other, i.e. to a same standard. The instructions for normalizing the electric powers produced by the individual photovoltaic modules to a same standard may be quite complex and do not have to be limited to a simple proportionality factor.

In that electric powers presently produced by the individual photovoltaic modules of the plurality of the photovoltaic modules may be used for defining the expected value of the electric power for each photovoltaic module, probability values for shadowing of individual photovoltaic modules at certain positions of the sun may not only be obtained with cloud-free sun but also with clouds in this embodiment of the method of the present invention, as long as shadows are formed by potentially shadow casting obstacles. This possibility, however, need not be used. Instead, this embodiment of the method of the present invention may purposefully also be restricted to defining the probability values to weather conditions with cloud-free sun and corresponding maximum shadow formation. Essential energy losses which are relevant for assessing shadowing events only occur under such weather conditions.

In the embodiment of the method of the present invention in which the expected value of the electric power for each photovoltaic module is determined based on the electric powers presently produced by several individual photovoltaic modules, the shadowing probability of the respective photovoltaic module may be set to a value of not more than zero for each position of the sun at which the electric power produced by the respective photovoltaic module on the present day reaches or exceeds the present expected value. Assuming that no shadowing occurs which affects all photovoltaic modules in the same way, an individual photovoltaic module may only then provide the maximum value of the normalized electric powers at a certain position of the sun, if it is not shadowed at this position of the sun.

Further, in this embodiment of the method of the present invention, the curve corresponding to an ideal power course may be fitted to peak values of the electric powers selected from (i) electric power recorded for the respective photovoltaic module at same positions of the sun during a plurality of previous days, (ii) normalized electric power recorded for all photovoltaic modules of the plurality of similar photovoltaic modules at same positions of the sun during a plurality of previous days, and (iii) expected values defined for the respective photovoltaic module at the same positions of the sun during a plurality of previous days. All variants (i), (ii) and (iii) will provide very similar ideal power courses; the results of variants (ii) and (iii) may actually be identical.

The electric voltage generated by the individual photovoltaic modules as such has proven to be an uncertain criterion for detecting shadowing of a photovoltaic module. Further, it is not well suited for assessing a shadowing event with regard to the associated energy loss. If, however, the electric power produced by each photovoltaic module is recorded and if an expected voltage value of the electric voltage generated by the photovoltaic module is defined for each position of the sun on the present day, a factor for the shadowing probability in the range from zero to one may be defined for all positions of the sun at which the electric power produced by the photovoltaic module on the present day falls short of the ideal power course, the height of the shadowing probability factor increasing with increasing deviation of the electric voltage generated by the photovoltaic module from the expected voltage value at the respective position of the sun. The expected voltage value may either be defined by the average value or median of the voltages of individual photovoltaic modules, if a plurality of photovoltaic modules are provided, or on the basis of the voltages generated by the photovoltaic module at the point in time of peak values of the electric power at the same position of the sun during the previous days, if only one photovoltaic module is provided.

In one embodiment of the present invention, the result of recognizing shadowing events is presented to the user of the respective solar power system in graphic form. To this end, in a display of the power course of the electric power produced by each photovoltaic module, such positions of the sun may be indicated at which a predominant shadowing probability has been determined. This may, for example, been made by easily associated symbols in a plot of the power course over the present day in which, for the purpose of easy association, the times of the day may be indicated instead of the associated positions of the sun.

At least for all positions of the sun at which the electric power produced by the photovoltaic module on the present day falls short of the ideal power course and at which no dominating shadowing probability is given, a clouding probability may be defined. In the simplest case the clouding probability at these positions of the sun may be the difference between the shadowing probability and one.

Then, positions of the sun at which a predominant clouding probability has been determined may additionally be indicated in the already mentioned display of the power course of the power produced by each photovoltaic module. Power losses as compared to the ideal power course which may also be displayed themselves may thus be easily assigned to a particular cause.

Additionally, amounts of energy which could not be generated as compared to the ideal power course may be quantified in the display of the power course of the electric power produced by each photovoltaic module. Then, the display of the power course indicates the reason and the extent of the not generated power.

However, the electric power which has not been generated on a certain day has little significance. A very significant display, however, results if the shadowing probabilities for the positions of the sun are entered in an annual overview map of the positions of the sun. Ideally, the azimuth angle of the position of the sun is plotted over one axis whereas the elevation angle is plotted over the other axis. From the distribution of the shadowing probabilities in such an annual overview map, the positions of shadow casting obstacles with regard to the respective photovoltaic module may be directly read. If the exact positions of the sun are not available, the shadowing probabilities may auxiliarily be plotted over the time of day along the one axis and over the time of year along the other axis, a semi-annual display being sufficient.

The shadowing probabilities indicated in the annual overview map may be coded in colors or gray scales.

To reduce the effects of statistical spread, the distribution of the shadowing probabilities over the annual overview map of the positions of the sun may be smoothened by averaging over neighbouring values. Afterwards, the distribution of the shadowing probabilities over the annual overview map may be filtered for dominating shadowing probabilities. For this purpose, a suitable threshold value of the shadowing probabilities above which a predominant shadowing probability may be assumed is to be set. After filtering, the annual overview map indicates those positions of the sun at which a shadowing of the respective photovoltaic modules is most probably given.

For these areas of the annual position of the sun overview map with predominant shadowing probability the associated amount of annual energy loss due to the shadowing may be indicated. In this way, a decision basis for possibly removing shadow casting obstacles or another arrangement of the photovoltaic modules is provided. In detail, a lower limit to the elevation angle of the position of the sun may be arbitrarily set for the range for which the associated amount of annual energy loss is indicated. This lowest considered position of the sun may, for example, correspond to that height to which a tree may be cut. The associated amount of annual energy loss indicates how much additional energy could have been generated by this measure in the previous year.

Now referring in greater detail to the drawings, the real course of the electric power of a photovoltaic module illustrated in FIG. 1 only corresponds to an ideal power course over the day if the photovoltaic module is subjected to cloud-free sun without shadow casting obstacles. Such periods of time are indicated by a sun symbol at the x-axis in FIG. 1. In the morning of the examined day, the sun, however, was clouded so that the actual electric power produced was reduced. In the afternoon, a shadow was cast onto the photovoltaic module so that—despite cloud-free sun—the power possibly produced under ideal circumstances was not achieved. This area is marked with a tree symbol along the x-axis. The moon symbol at the x-axis indicates night time without light. Besides the course of the power actually produced by the photovoltaic module, FIG. 1 indicates the result of an analysis of this power course which has been carried out according to the method of the present invention.

Figure 2:
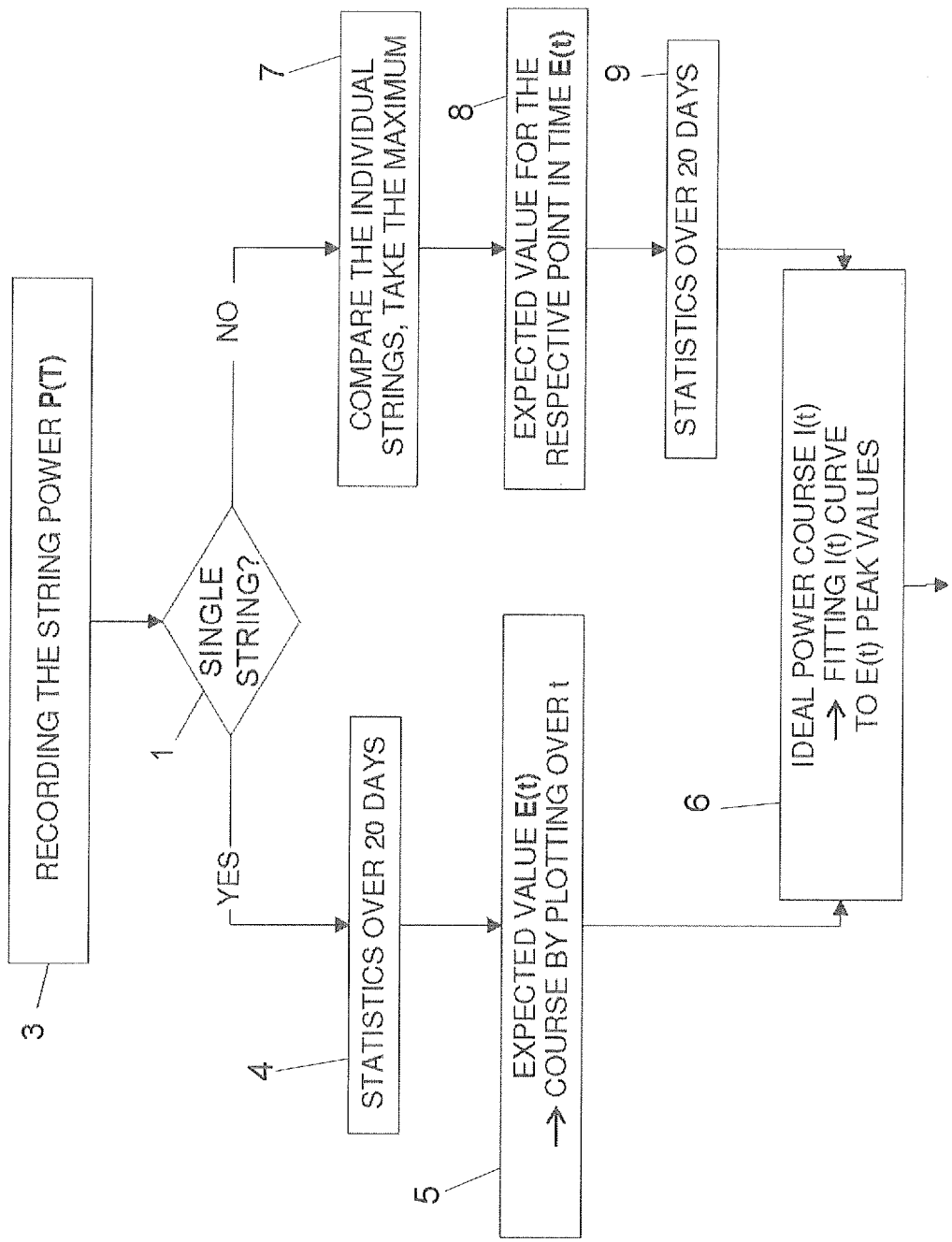
FIG. 2 is a flow chart of the method of the present invention.

This method of the present invention is illustrated in FIG. 2 as a flow chart. The flow chart branches into two steps at step 1 depending on whether measurement values from only one photovoltaic module, which is here designated as a string, or whether measurement values from a plurality of similar photovoltaic modules are available for recognizing and assessing shadowing events. The flow chart branches towards the left in case of only one photovoltaic module and towards the right in case of several similar photovoltaic modules. In both cases, in a first step 3, the actual electric power P(t) produced by each photovoltaic module or string is recorded. In case of only one string (YES at step 1) the power values are collected for statistics over a period of 20 days at step 4, this period of 20 days being suitable as a rule but only an example and may also be extended or shortened. From the statistics, expected values E(t) of the power of the photovoltaic module for a present day are determined at step 5. For this purpose, only maximum values of the electric power P(t) produced by the photovoltaic module during corresponding day times within the last 20 days are used in one embodiment. From the expected values E(t), an ideal power course I(t) over the actual day is determined by fitting a curve to the peak values of E(t) at step 6. This step of fitting an ideal power course I(t) to peak values of the recorded electric powers is also a feature of the procedure in case of several strings (NO at step 1). Here, however, the expected value E(t) for each point in time is defined as the maximum at step 7 of the normalized powers P(t) produced by the individual strings which have been normalized to a same standard at step 8. These effective values E(t) are collected over 20 days for statistics at step 9. To the peak values of these statistics the curve of the ideal power course I(t) is fitted. The ideal power course I(t) corresponds to cloud-free sun without shadow casting obstacles in both cases.

Figure 3:
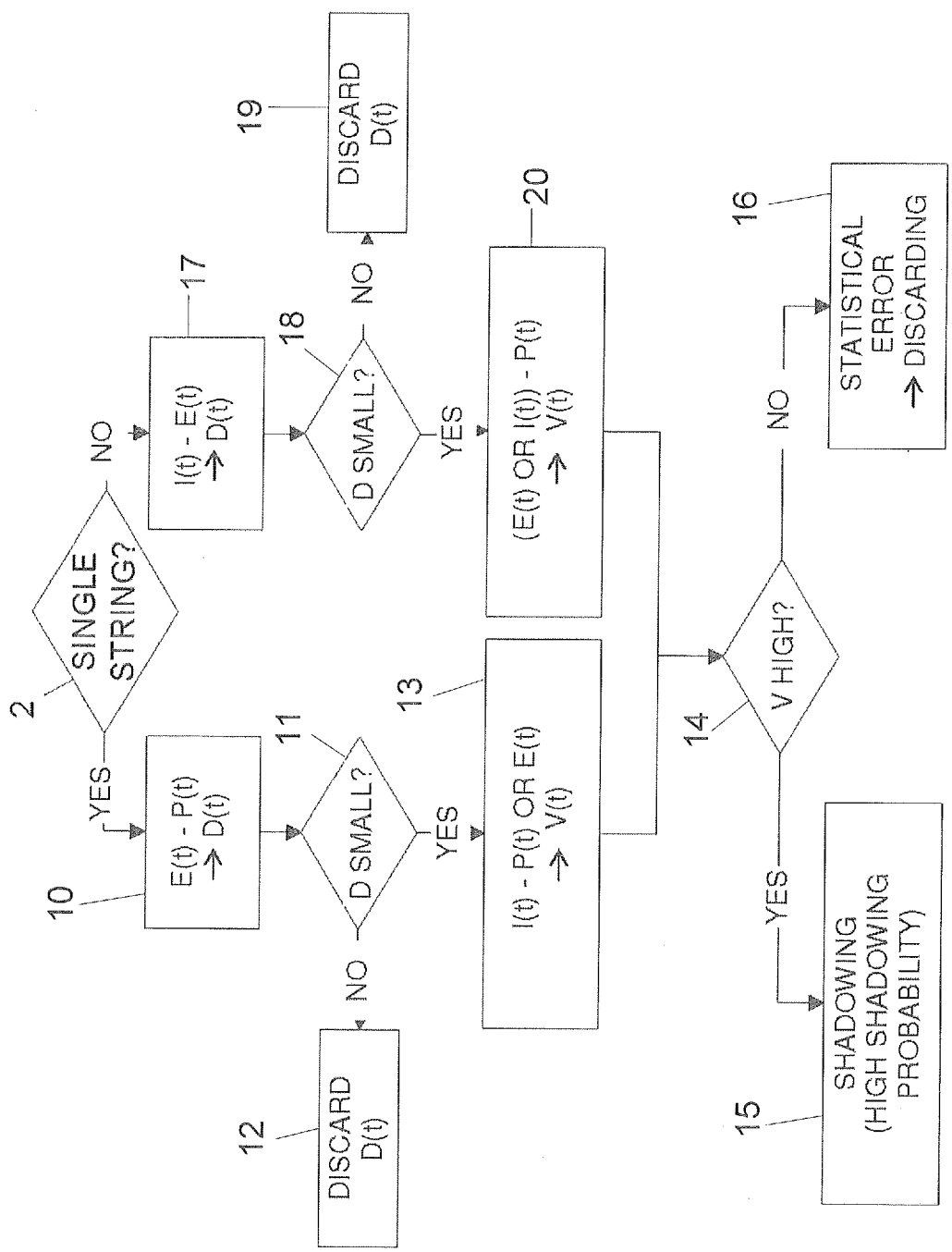
FIG. 3 is a flow chart of the method of the present invention.

Continuing with FIG. 3, in case of just one photovoltaic module (YES at step 2), next a difference D(t) between the actual power value at the point in time t and the expected value at the point in time t is formed at step 10. If this difference D is high, i.e. not small (NO at step 11), because it is for example at least 20% or at least 40% or at least 60%, which indicates a clouded day, this value of D(t) is discarded at step 12. If, however, the value of D is small (YES at step 11), i.e. if the actual power value P(t) corresponds to the expected value E(t), which indicates a cloudless day, a difference V(t) to the ideal power I(t) at the point in time t is calculated at step 13. If this difference V is high (YES at step 14), there is a high shadowing probability at step 15. If this difference, however, is small (NO at step 14), a statistical error is assumed and the value is discarded at step 16.

In case of several strings (NO at step 2), at first a difference D(t) between the expected value at the point in time t and the ideal power value I(t) at the point in time t is determined (at step 17). If this difference is small (YES at step 18), this—like a small difference D(t) in the parallel query in case of just one string—indicates that there are no clouds and that the further evaluation of the value of D(t) may be worthwhile. If the difference, however, is not small (NO at step 18), it is an indication of clouds, and the value of D(t) is discarded at step 19. In case of a small D, a difference between the actual power value P(t) and the expected value E(t) or the ideal power value I(t) is formed at step 20. This difference V(t) is again assessed whether it is high at step 14 which is taken as an indication of a shadowing at step 15, whereas small values of V are discarded as statistical errors at step 16. Depending on the value of V, shadowing probabilities may be defined in both cases, i.e. both with one string and several strings.

Figure 4:
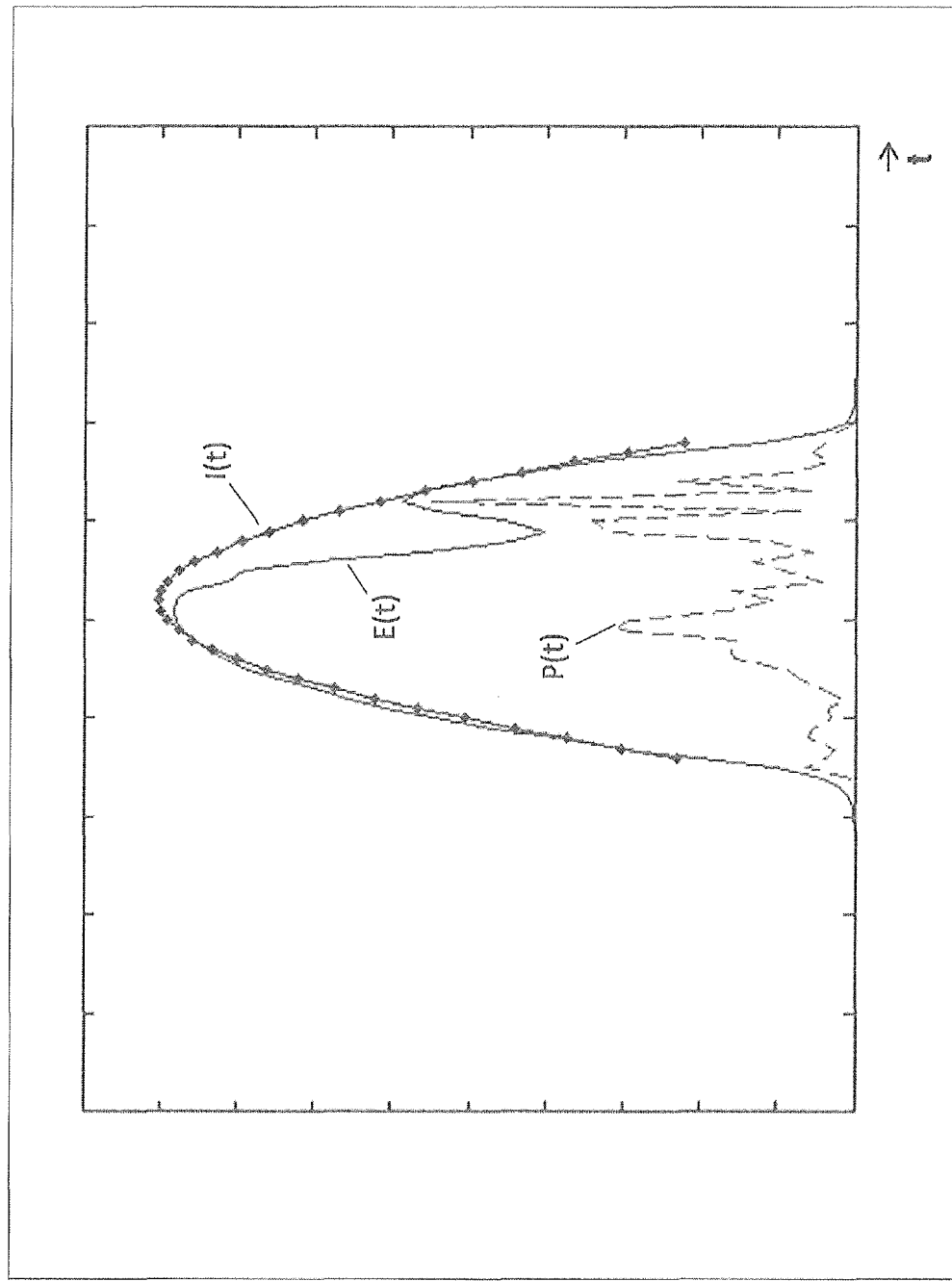
FIG. 4 contrasts the real power course of the electric power produced by a photovoltaic module with an expected power course and an ideal power course over a present day.

FIG. 4 is a plot of different power curves over a day. The lowest dashed curve indicates the actually measured power P(t) of a photovoltaic module. This dashed curve punctually gets close to the expected power course E(t) of the photovoltaic module which has been determined from the maximum values of the electric powers P(t) produced at the same position of the sun during the previous days. The ideal power course I(t) which corresponds to cloudless sun without shadow casting obstacles over the entire day is fitted to the peak values of E(t).

Figure 5:
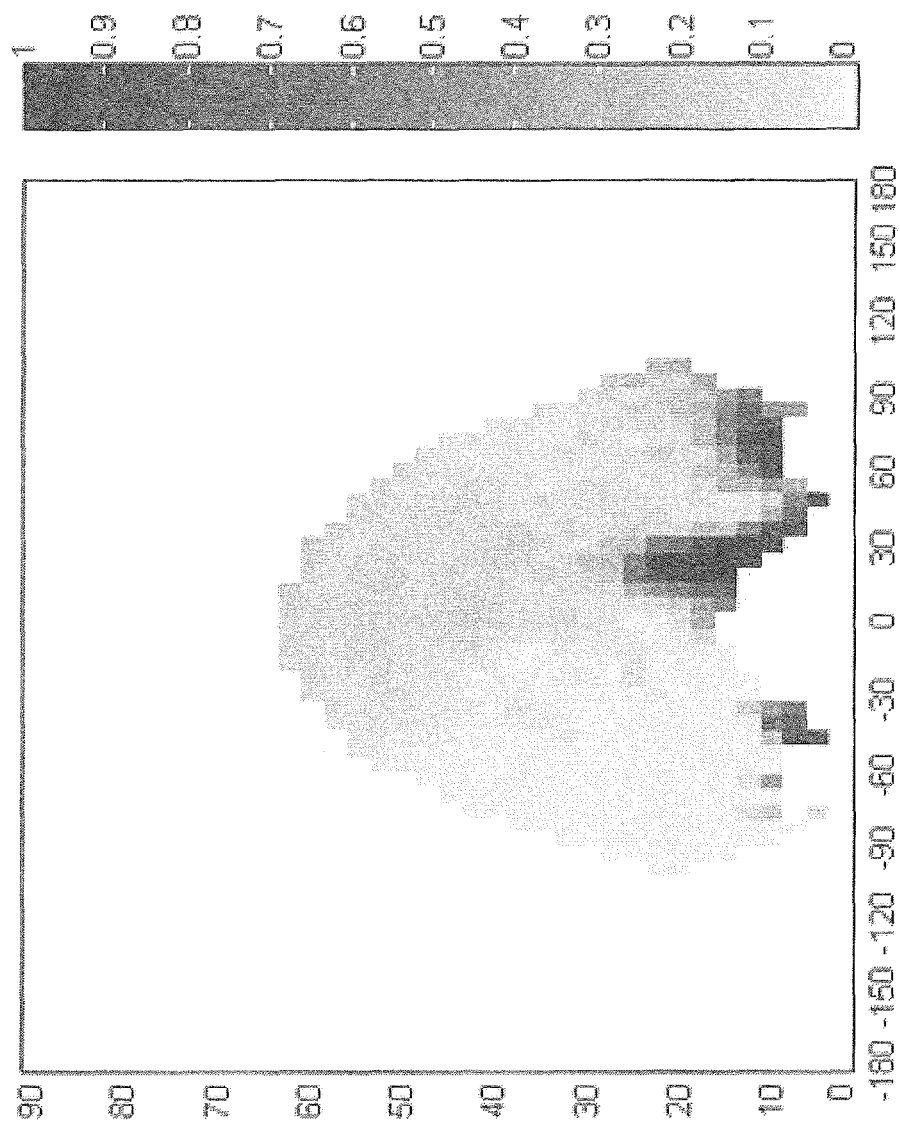
FIG. 5 is a depiction of shadowing probabilities of a photovoltaic module indicated in grey scales in an annual overview map of the positions of the sun, in which the azimuth angle of the position of the sun is plotted over the x-axis, and the elevation angle of the position of the sun is plotted over the y-axis.

In FIG. 5 the shadowing probabilities determined by the method according to FIGS. 2 and 3 are entered at the associated position of the sun in an overview map of the positions of the sun which covers the positions of the sun of an entire year and which in so far is also designated as an annual overview map. Here, the azimuth angle of the position of the sun is plotted along the x-axis, whereas the elevation angle of the position of the sun is plotted along the y-axis. The darker the grey scale, the higher is the shadowing probability at the individual positions of the sun. The depicted annual overview map has been generated by averaging over the shadowing probabilities determined on the individual days. This averaging may be made by simple average value formation over each of the fields in the annual overview map representing one position of the sun. In calculation of the average values, only such shadowing probabilities are considered which have been defined in the method of the present invention; i.e. a not existing value is not considered as a shadowing probability of zero.

Figure 6:
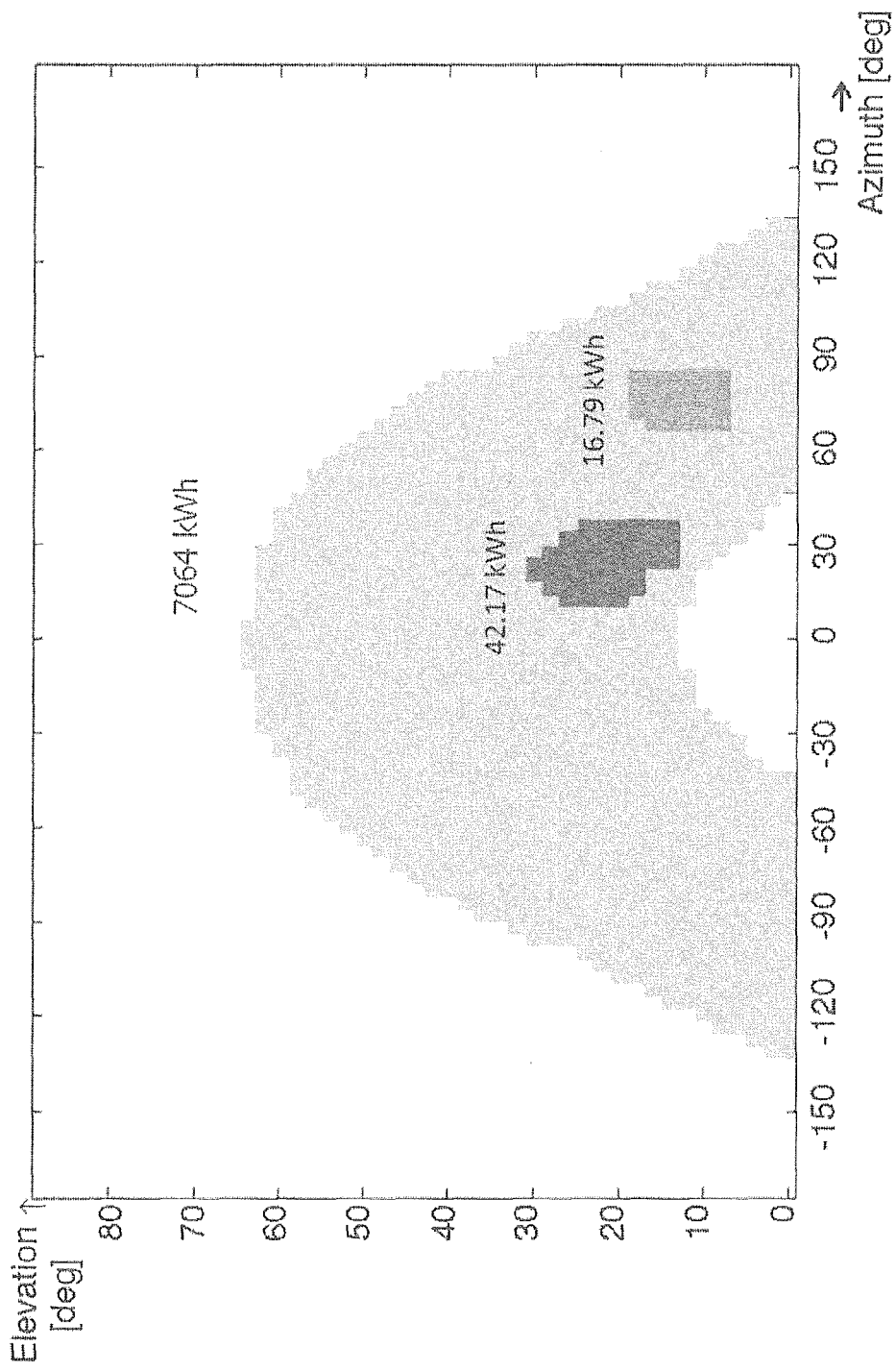
FIG. 6 is an annual overview map of positions of the sun, in which areas of predominant shadowing probabilities of the photovoltaic module are indicated after filtering an original shadowing probability distribution with a threshold value, and in which amounts of energy loss are indicated for closed areas of the position of the sun with dominating shadow probability.

FIG. 6 shows the annual overview map according to FIG. 5 after edge filtering with a threshold for a predominant shadowing probability. Here, two closed areas have been identified in which a predominant shadowing probability exists. For these areas, the annual amount of energy is indicated which could not be produced due to the shadowing. These amounts are compared to the overall amount of energy which has been generated by the photovoltaic module during the entire year. Thus, a criterion is provided to decide whether it is suitable to remove the cause of the shadowing events recognized. The obstacles casting the shadows will be found in particular directions from the respective photovoltaic module which may be directly read from the annual overview map of the positions of the sun.

Many variations and modifications may be made to the preferred embodiments of the invention without departing substantially from the spirit and principles of the invention. All such modifications and variations are intended to be included herein within the scope of the present invention, as defined by the following claims.

The invention claimed is:

1. A method of recognizing shadowing events caused by shadow casting obstacles that are essentially opaque, and affecting at least one individual photovoltaic module of a plurality of similar photovoltaic modules, the method comprising:

recording the electric power values produced by all individual photovoltaic modules of the plurality of similar photovoltaic modules at multiple positions of the sun over a plurality of days;

normalizing the recorded electric power values to a common standard;

defining an expected power value of the normalized electric power value produced by each individual photovoltaic module of the plurality of similar photovoltaic modules separately for each of the multiple positions of the sun as a maximum value of the normalized electric power values that are at a present day produced by the individual photovoltaic modules of the plurality of similar photovoltaic modules at the respective position of the sun, wherein the expected value of the electric power comprises an influence of clouds affecting all individual photovoltaic modules of the plurality of similar photovoltaic modules;

defining an ideal power course of the electric power produced by each individual photovoltaic module over the present day by fitting a curve to peak values of the electric power values recorded for at least one photovoltaic module of the plurality of similar photovoltaic modules at the same positions of the sun during a plurality of previous days, the curve corresponding to cloud-free sun without shadow casting obstacles;

comparing the electric power values produced by each of the individual photovoltaic modules at each of the multiple positions of the sun on the present day with the respective ideal power course and the respective expected value;

for all positions of the sun at which the electric power value produced by any individual photovoltaic module falls short of the ideal power course on the present day, defining a shadowing probability for the respective photovoltaic module of not less than zero, a magnitude of the shadowing probability for the respective photovoltaic module increasing with increasing difference between the normalized electric power value produced by the respective photovoltaic module and the expected power value at the respective position of the sun; and using the shadowing probability as a criterion for determining whether or not to remove a shadow casting obstacle and removing the shadow casting obstacle if determined to do so.

2. The method of claim 1, wherein for each position of the sun at which the recorded electric power value of the at least one photovoltaic module on the present day reaches or exceeds to the maximum value of normalized electric power value produced by a plurality of similar photovoltaic modules at the respective position of the sun on the present day a shadowing probability of not more than zero is defined for the at least one photovoltaic module.

3. The method of claim 1, wherein, in a display of a power course of the power produced by the at least one photovoltaic module, those positions of the sun are indicated at which a predominant shadowing probability has been defined.

4. The method of claim 1, wherein a clouding probability is defined at least for all positions of the sun at which the recorded electric power value of the photovoltaic module on the present day falls short of the ideal power course and at which no predominant shadowing probability is defined.

5. The method of claim 4, wherein, in a display of a power course of the power produced by the at least one photovoltaic module, those positions of the sun are indicated at which a predominant clouding probability is given.

6. The method of claim 1, wherein, in a display of a power course of the recorded power of the at least one photovoltaic module, amounts of energy which could not be generated as compared to the ideal power course are indicated.

7. The method of claim 6, wherein, in the display of a power course of the recorded power of the at least one photovoltaic module, a most probable cause is indicated for each amount of energy that was not generated as compared to the ideal power course.

8. The method of claim 1, wherein the shadowing probabilities that have been defined for positions of the sun are entered in an annual overview map of the positions of the sun.

9. The method of claim 8, wherein a distribution of the shadowing probabilities over the annual overview map of the positions of the sun is smoothed by averaging.

10. The method of claim 9, wherein the distribution of the shadowing probabilities over the annual overview map of the positions of the sun is filtered for predominant shadowing probability.

11. The method of claim 10, wherein an associated annual amount of energy loss is indicated for at least one area of the annual overview map of the positions of the sun with predominant shadowing probability.

12. The method of claim 11, wherein a lower limit for a sun elevation angle in the area for which the associated annual amount of energy loss is indicated is arbitrarily set.

13. The method of claim 8, wherein a distribution of the shadowing probabilities over the annual overview map of the positions of the sun is filtered for predominant shadowing probability.

14. The method of claim 1, wherein, in defining an ideal power course, the curve is fitted to peak values of the electric power values selected from:

electric power recorded for the respective photovoltaic module at same positions of the sun during a plurality of previous days, and expected values defined for the respective photovoltaic module at same positions of the sun during a plurality of previous days.

15. A method of recognizing a shadowing event caused by an obstacle between a given photovoltaic module of a plurality of photovoltaic modules and the sun, the method comprising:

recording electric power values produced by each photovoltaic module of the plurality of photovoltaic modules at multiple positions of the sun over a plurality of days;

normalizing the recorded electric power values to a common standard;

defining an expected power value as a maximum value of the normalized electric power values at a given position of the sun of a present day, wherein the expected power value comprises an influence of clouds affecting all photovoltaic modules;

determining an ideal power course by fitting a curve to peak values of the expected power values recorded for each of the multiple positions of the sun during a plurality of previous days, the curve corresponding to cloud-free sun without shadow casting obstacles and defining an ideal power value at each of the multiple positions of the sun;

comparing the expected power value at the given position of the sun of the present day with the ideal power value at the given position of the sun and, if a difference between the expected power value and the ideal power value indicates no clouds;

determining a shadowing probability for the given photovoltaic module at the given position of the sun, the shadowing probability increasing with increasing difference between the normalized electric power value produced by the given photovoltaic module and the expected power value at the given position of the sun; and using the shadowing probability as a criterion for determining whether or not to remove a shadow casting obstacle and removing the shadow casting obstacle if determined to do so.

16. The method of claim 15, wherein the difference between the expected power value and the ideal power value indicates no clouds if it is less than 40%.

17. The method of claim 15, wherein the difference between the expected power value and the ideal power value indicates no clouds if it is less than 20%.

18. The method of claim 15, wherein, in a display of a power course of the recorded power of the given photovoltaic module, amounts of energy which could not be generated due to the obstacle are displayed.

19. The method of claim 15, wherein the shadowing probabilities that have been determined for the given photovoltaic module at various given positions of the sun are entered in an annual overview map of the positions of the sun, wherein an associated annual amount of energy loss due to the obstacle is indicated.

* * * * *